(12) United States Patent
Borst et al.

(10) Patent No.: US 6,693,357 B1
(45) Date of Patent: Feb. 17, 2004

(54) METHODS AND SEMICONDUCTOR DEVICES WITH WIRING LAYER FILL STRUCTURES TO IMPROVE PLANARIZATION UNIFORMITY

(75) Inventors: Christopher Lyle Borst, Plano, TX (US); Alwin J. Tsao, Garland, TX (US); Bobby David Strong, Sachse, TX (US); Noel Russell, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/388,042

(22) Filed: Mar. 13, 2003

(51) Int. Cl.⁷ .......................... H01L 23/48; H01L 23/52
(52) U.S. Cl. .................. 257/773; 257/774; 257/775; 257/762
(58) Field of Search ................. 257/773, 774, 257/775, 750, 752, 758, 762

(56) References Cited

U.S. PATENT DOCUMENTS

| 5,494,853 | A |   | 2/1996  | Lur            |         |
|-----------|---|---|---------|----------------|---------|
| 5,598,010 | A |   | 1/1997  | Uematsu        |         |
| 5,625,232 | A |   | 4/1997  | Numata et al.  |         |
| 5,751,056 | A |   | 5/1998  | Numata         |         |
| 5,811,352 | A |   | 9/1998  | Numata et al.  |         |
| 5,854,125 | A |   | 12/1998 | Harvey         |         |
| 5,888,900 | A |   | 3/1999  | Mizuno et al.  |         |
| 5,923,947 | A |   | 7/1999  | Sur            |         |
| 5,998,814 | A | * | 12/1999 | Yamaha et al.  | 257/758 |
| 6,045,435 | A | * | 4/2000  | Bajaj et al.   | 438/692 |
| 6,069,067 | A | * | 5/2000  | Kinugawa       | 438/622 |
| 6,259,115 | B1|   | 7/2001  | You et al.     |         |
| 6,303,977 | B1| * | 10/2001 | Schroen et al. | 257/635 |
| 6,323,113 | B1|   | 11/2001 | Gabriel et al. |         |
| 6,396,146 | B2|   | 5/2002  | Nakayama       |         |
| 6,436,807 | B1|   | 8/2002  | Cwynar et al.  |         |
| 6,504,254 | B2| * | 1/2003  | Takizawa       | 257/758 |
| 6,528,883 | B1| * | 3/2003  | Dunham et al.  | 257/758 |
| 6,614,120 | B2| * | 9/2003  | Sato et al.    | 257/758 |
| 2001/0022399 | A1 | * | 9/2001 | Koubuchi et al. | 257/758 |
| 2002/0056070 | A1 |   | 5/2002 | Tanaka          |         |
| 2002/0175419 | A1 |   | 11/2002 | Wang et al.    |         |

* cited by examiner

*Primary Examiner*—Jasmine Clark
(74) *Attorney, Agent, or Firm*—Jacqueline J. Garner; W. James Brady, III; Frederick J. Telecky, Jr.

(57) ABSTRACT

Semiconductor devices and manufacturing methods therefor are disclosed, in which conductive fill structures are provided in fill regions in an interconnect wiring layer between conductive wiring structures to facilitate planarization uniformity during metalization processing. One approach employs fill structures of varying sizes where smaller fill structures are formed near wiring regions having high aspect ratio wiring structures and larger fill structures are located near wiring regions with lower aspect ratio wiring structures. Another approach provides fill structures with varying amounts of openings, with fill structures having few or no openings being provided near low aspect ratio wiring structures and fill structures having more openings being located near higher aspect ratio wiring structures.

63 Claims, 8 Drawing Sheets

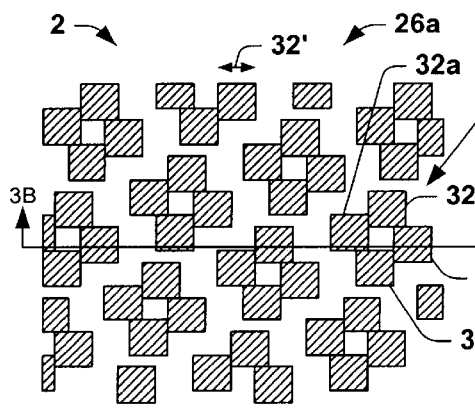
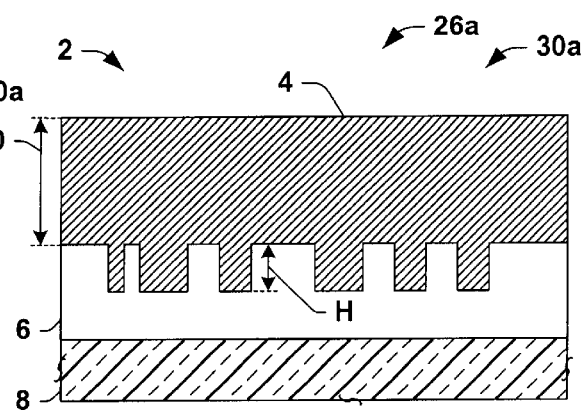
Fig. 3A                              Fig. 3B
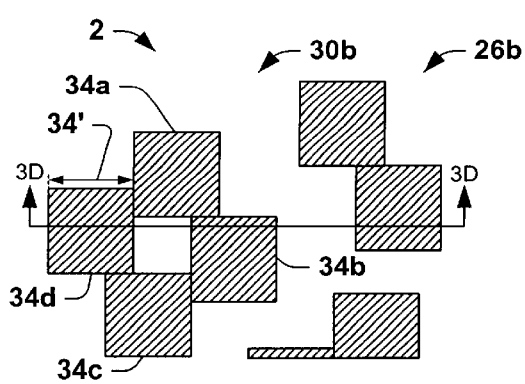
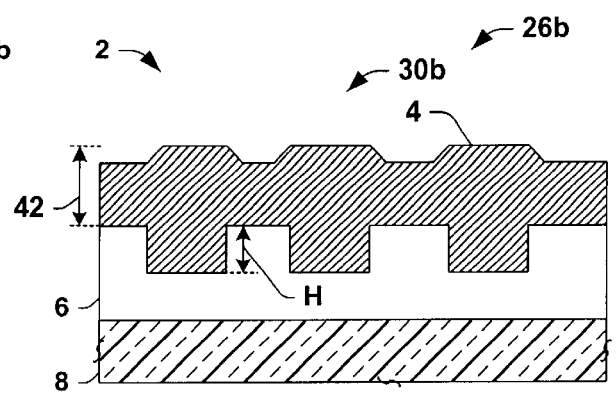
Fig. 3C                              Fig. 3D
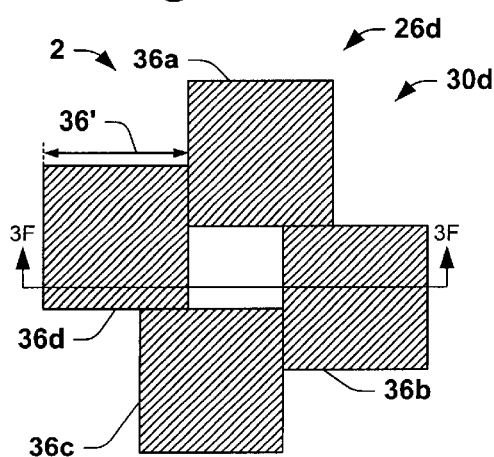
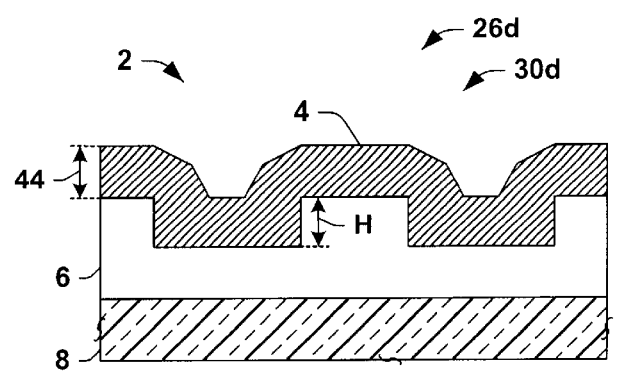
Fig. 3E                              Fig. 3F

METHODS AND SEMICONDUCTOR DEVICES WITH WIRING LAYER FILL STRUCTURES TO IMPROVE PLANARIZATION UNIFORMITY

FIELD OF INVENTION

The present invention relates generally to semiconductor devices and more particularly to fabrication methods and devices employing wiring layer conductive fill structures to facilitate uniform planarization in manufacturing semiconductor devices.

BACKGROUND OF THE INVENTION

In the manufacture of semiconductor products such as integrated circuits, individual electrical devices are formed on or in a semiconductor body, and are thereafter interconnected to form electrical circuits. Interconnection of these devices within an integrated circuit (sometimes referred to as metalization or interconnect processing) is typically accomplished by forming a multi-level interconnect network structure in layers formed over the electrical devices, by which the electrical components are interconnected to create the desired circuits. Individual wiring layers within the multi-level interconnect network are formed by depositing an insulating or dielectric layer over the discrete devices or over a previous interconnect layer, and patterning and etching openings or cavities such as vias and/or trenches. Conductive material is then deposited into the openings to form inter-layer contacts and wiring traces. The wafer is then planarized to separate the conductive material in the individual cavities, thereby creating one level or interconnect layer. Dielectric or insulating material is then deposited over this layer and the process may be repeated any number of times to construct additional wiring levels formed within the additional dielectric layers with conductive vias therebetween to form the multi-level interconnect network.

As device densities and operational speeds continue to increase, reduction of the delay times in integrated circuits is desired. These delays are sometimes related to the resistance of interconnect metal lines through the multi-layer interconnect networks as well as to the capacitance between adjacent metal lines. In order to reduce the resistivity of the interconnect metal lines formed in metal layers or structures, recent interconnect processes have employed copper instead of aluminum. Interconnect layers using copper are commonly fabricated using single and dual damascene interconnect processes or techniques in which cavities, such as vias and trenches, are formed (etched) in a dielectric insulating layer. Copper is deposited into the cavities and over the insulating layer, typically using electro-chemical deposition (ECD) techniques preceded by formation of appropriate diffusion barrier and copper seed layers. Once the copper is deposited to fill the cavities, planarization using a chemical mechanical polishing (CMP) or other process is performed, leaving a copper wiring pattern including the desired interconnect metal lines inlaid within the dielectric layer trench and via cavities. In a single damascene process, copper trench patterns or vias are created which connect to existing interconnect structures thereunder, whereas in a dual damascene process, both vias and the trenches are filled at the same time using a single copper deposition and are then planarized using a single CMP planarization operation.

Depending upon the particular circuits and components fabricated in a wafer, the conductive interconnect wiring structures employed for interconnecting components are often of varying dimensions in a given integrated circuit. For instance, lines carrying low amounts of current may be made relatively narrow, whereas power connections and other routing structures required to conduct larger amounts of current need to be made wider (e.g., larger cross sectional area) so as to reduce line resistance and thereby to reduce power loss through heating. Interconnect wiring structure dimensions may also be tailored with an eye toward reducing RC time delays in high speed circuitry. In typical damascene interconnect structures, the depth of trenches filled with copper for interconnection of electrical devices is uniform across the device in any given layer. Consequently, designers vary the trench widths for different routed signals in each metalization layer to control the resistivity of the resulting wiring structure, where wider trenches are used for higher current interconnections.

At the same time, certain signals may need to be separated from other signals by minimum spacing distances, where such design considerations affect the wiring density, and hence the number of interconnect levels required to interconnect a given circuit. In this regard, manufacturing costs increase as more routing or interconnect layers are added. As device densities and routing densities continue to be increased, wiring structure widths have become smaller, wherein narrow wiring structures are formed using trenches and vias having fairly large aspect ratios (e.g., the ratio of the cavity height to the cavity width), and wider wiring structures are formed using lower aspect ratio cavities. The resulting wiring structures after planarization have corresponding aspect ratios, where the height may be reduced somewhat by the planarization process.

Ideally, the deposition of copper is uniform during interconnect layer fabrication, and the subsequent planarization step leaves the wafer with a smooth planar surface. However, conventional copper deposition processing techniques often result in surface topology variations across a wafer surface prior to planarization. CMP planarization processing in the presence of such topology is non-uniform, resulting in more material being removed from certain areas than from others (sometimes referred to as dishing). As a result, non-uniform surface topology remains following the planarization process. Subsequent processing steps, such as patterning overlying insulating layers to form further interconnect layers in the presence of such topology variations may be adversely affected by such non-uniform surface topology. Thus, there is a need for improved interconnect processing techniques by which topology variation can be mitigated or reduced in the manufacture of semiconductor devices.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. The invention relates to semiconductor devices and manufacturing methods therefor, in which conductive fill structures are provided in fill regions in an interconnect wiring layer between conductive wiring structures to facilitate planarization uniformity during metalization processing.

In accordance with one aspect of the invention, conductive dummy fill structures of varying sizes are employed in fill regions between wiring regions. This may be employed to advantageously provide more uniform conductive material deposition, resulting in improved planarization uniformity. In one example, smaller fill structures are formed near wiring regions having high aspect ratio wiring structures and larger fill structures are located near wiring regions with lower aspect ratio wiring structures, wherein the fill structures may be patterns of varying pattern size. This provides a gradual transition between overfilled and conformally filled wiring regions and thus better uniformity in deposited conductive material thickness, compared with layouts having no dummy fill features, or dummy metal fill structures of a single size and shape. Accordingly, better planarization uniformity may be achieved, for example, having less overpolish and underpolish during CMP processing. This aspect of the invention may be employed during device layout to tailor dummy metal fill for individual metal layer mask designs.

Another aspect of the invention provides conductive fill structures with varying amounts of openings. In one example, the fill structures are conductive areas formed into patterns, wherein one or more of the conductive areas include slot shaped openings comprising insulating material surrounded by conductive material of the fill structure, although other fill structures and opening sizes and/or shapes may be employed. This aspect of the invention provides the possibility of selective provision of conductive fill structures with varying numbers or sizes of openings to achieve a gradual transition between overfilled and conformally filled wiring regions. For example, fill structures having few or no openings may be provided near low aspect ratio wiring structures while fill structures having more openings are located near higher aspect ratio wiring structures. Still another aspect of the invention provides fill structures formed in a semiconductor body between isolation regions (e.g., such as STI isolation regions), where the fill structures are of varying pattern sizes and/or varying numbers or types of openings.

Further aspects of the invention provide semiconductor device fabrication methods, comprising forming an insulating layer over a wafer and forming first and second conductive wiring structures having first and second aspect ratios in corresponding wiring regions of the insulating layer. The methods further comprise forming two or more conductive fill structures, such as patterns of conductive areas in a fill region between the first and second wiring regions. In one aspect, first and second fill structures are formed as patterns of conductive areas, wherein the sizes of the first and second patterns are different. In another aspect, a first conductive fill structure comprises an opening, and a second conductive fill structure is formed having a different number of openings than the first conductive fill structure, including more, fewer, or none.

The following description and annexed drawings set forth in detail certain illustrative aspects and implementations of the invention. These are indicative of but a few of the various ways in which the principles of the invention may be employed.

BRIEF DESCRIPTION OF THE DRAWINGS

FIG. 3A is a top plan view illustrating several exemplary first conductive fill structures of the device of FIGS. 2A–2C, having relatively small pattern size;

FIG. 3B is a partial side elevation view in section taken along line 3B–3B in FIG. 3A illustrating significant copper overfill near the exemplary first fill structures prior to planarization;

FIG. 3C is a top plan view illustrating an exemplary second conductive fill structure of the device of FIGS. 2A–2C, having a somewhat larger pattern size than the structures of FIG. 3A;

FIG. 3D is a partial side elevation view in section taken along line 3D—3D in FIG. 3C illustrating a lesser degree of overfill near the exemplary second fill structure prior to planarization;

FIG. 3E is a top plan view illustrating another exemplary conductive fill structure of the device of FIGS. 2A–2C, having a larger pattern size than the structures of FIGS. 3A and 3C;

FIG. 3F is a partial side elevation view in section taken along line 3F—3F in FIG. 3E illustrating generally conformal copper fill near the exemplary fill structure of FIG. 3E prior to planarization;

DETAILED DESCRIPTION OF THE INVENTION

Figure 1A:
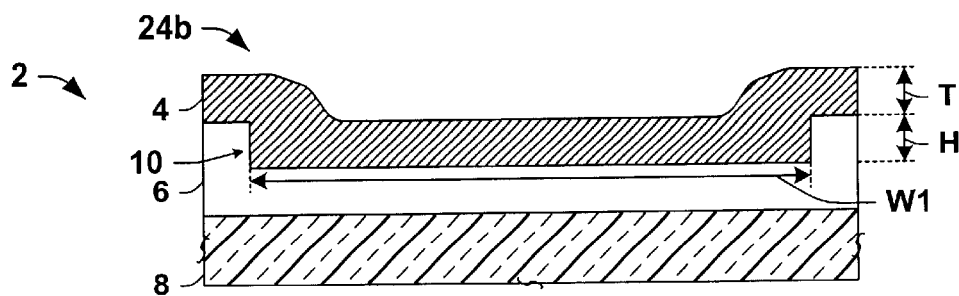
FIGS. 1A–1D are partial side elevation views in section illustrating wiring structures of different aspect ratios at an intermediate stage of fabrication following deposition of conductive material in cavities of an insulating layer, wherein overfill is seen near high aspect ratio structures and conformal fill is found near lower aspect ratio structures.

One or more exemplary implementations of the present invention will now be described with reference to the attached drawings, wherein like reference numerals are used to refer to like elements throughout. The invention relates to semiconductor devices and manufacturing methods therefor, in which conductive fill structures are provided in fill regions between wiring regions in the fabrication of interconnect layers or levels during interconnect (e.g., metalization) processing. Several implementations are illustrated in the drawings and described below exemplifying one or more aspects of the invention, wherein the structures in the figures are not necessarily drawn to scale, and wherein the invention is not limited to the illustrated examples.

Referring initially to FIGS. 1A–1D, portions of an exemplary semiconductor device 2 are illustrated, in which conductive copper wiring structures of different aspect ratios are shown at an intermediate stage of fabrication following deposition of conductive copper material 4 in cavities of a dielectric insulating layer 6 formed over a silicon semiconductor body 8. As can be seen in FIGS. 1A–1D, copper overfill is seen near high aspect ratio structures and conformal copper fill is found near lower aspect ratio structures. In FIG. 1A, a wiring structure 10 is illustrated after copper deposition and before planarization, where the structure 10 has a low aspect ratio (e.g., submicron structures with widths between about 0.01 and 10 um and aspect ratios less than 0.5 in FIGS. 1A–1D) defined as the ratio of the cavity height H divided by the cavity width W1. In this case, the copper fill is generally conformal, resulting in deposited copper of a thickness T overlying the top surfaces of the insulating layer 6 before planarization, where T is roughly equal to the cavity height H in the illustrated example.

Figure 1B:
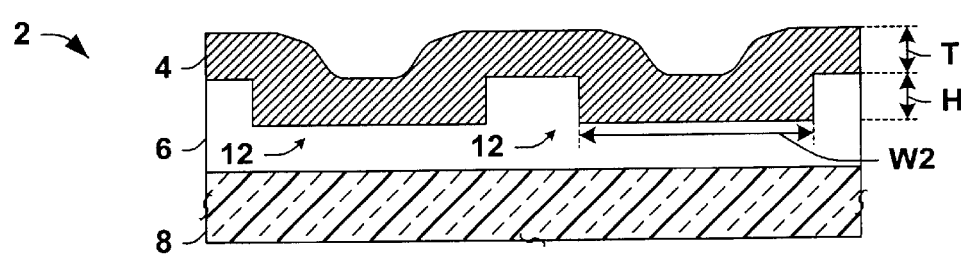
Figure 1C:
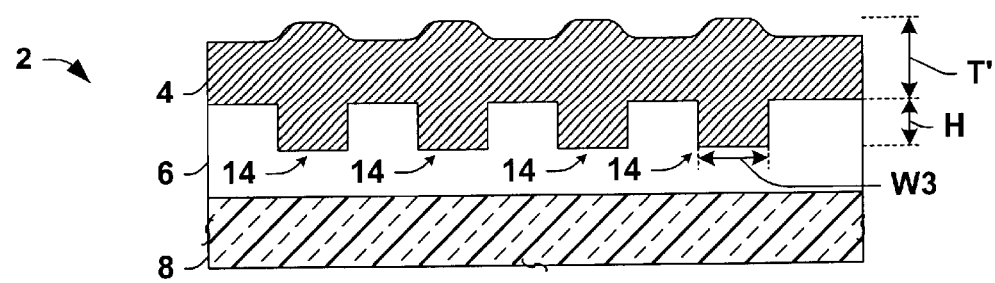
Figure 1D:
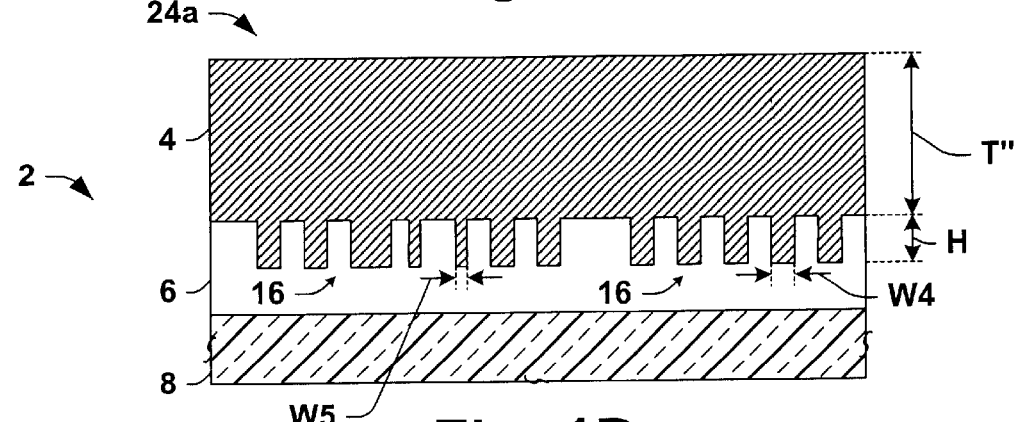

FIG. 1B illustrates two narrower wiring structures 12 in the device 2 having smaller widths W2, and accordingly a larger aspect ratio (e.g., H/W2). In the example of FIG. 1B, the copper fill is still generally conformal, providing deposited copper of thickness T overlying the top surfaces of the insulating layer 6. FIG. 1C illustrates several still narrower wiring structures 14 of still higher aspect ratios (e.g., approximately 1.0 in this example) defined as the ratio of the cavity height H divided by a width W3. In this example, copper overfill is seen, wherein the copper material 4 overlies the top surface of the dielectric material 6 by a thickness T', wherein T' is greater than the thickness T in FIGS. 1A and 1B. In FIG. 1D, wiring structures 16 are illustrated having even higher aspect ratios H/W4 and H/W5, resulting in significant overfill to a thickness T" much higher than the conformal fill thickness T in FIGS. 1A and 1B.

The inventors have appreciated that copper deposition conformality at a given location on a wafer surface is affected by the aspect ratio of cavities being filled at that location. In this regard, the inventors have found that locations having high aspect ratio cavities (e.g., cavities 14 and 16 in FIGS. 1C and 1D having aspect ratios of about 0.5 or more) may be overfilled by as much as 3000 to 5000 Å compared to locations having lower aspect ratio cavities (e.g., cavities 10 and 12 in FIGS. 1A and 1B) at which conformal filling is found. Such non-uniform copper deposition results in non-uniform copper topology variations or bumps in different areas of the device 2, which are polished or cleared differently during subsequent CMP planarization, leading to extensive overpolish of low aspect ratio conductive wiring features, and the possibility of underpolish of high aspect ratio features. In addition to difficulties in planarization processing, subsequent processing steps may be adversely affected by such non-uniform surface topology, for instance, including patterning overlying insulating layers to form further interconnect layers. Moreover, overpolishing of low aspect ratio (e.g., wide) interconnect structures may reduce the area and thereby increase the resistance of routing lines used for higher current carrying circuits.

Figure 2A:
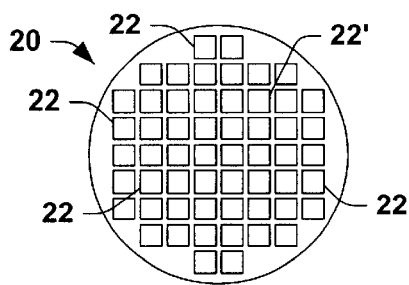
FIG. 2A is a simplified top plan view illustrating an exemplary wafer having a plurality of individual die areas being processed during semiconductor device manufacturing in accordance with one or more aspects of the present invention.
Figure 2B:
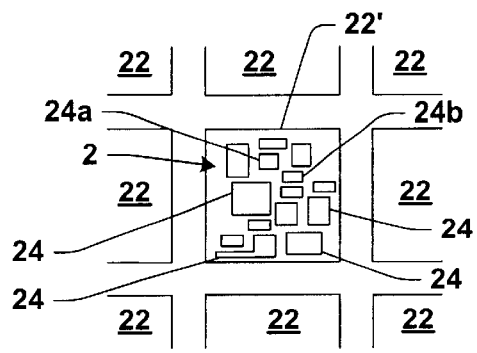
FIG. 2B is a top plan view illustrating an exemplary portion of the wafer of FIG. 2A.
Figure 2C:
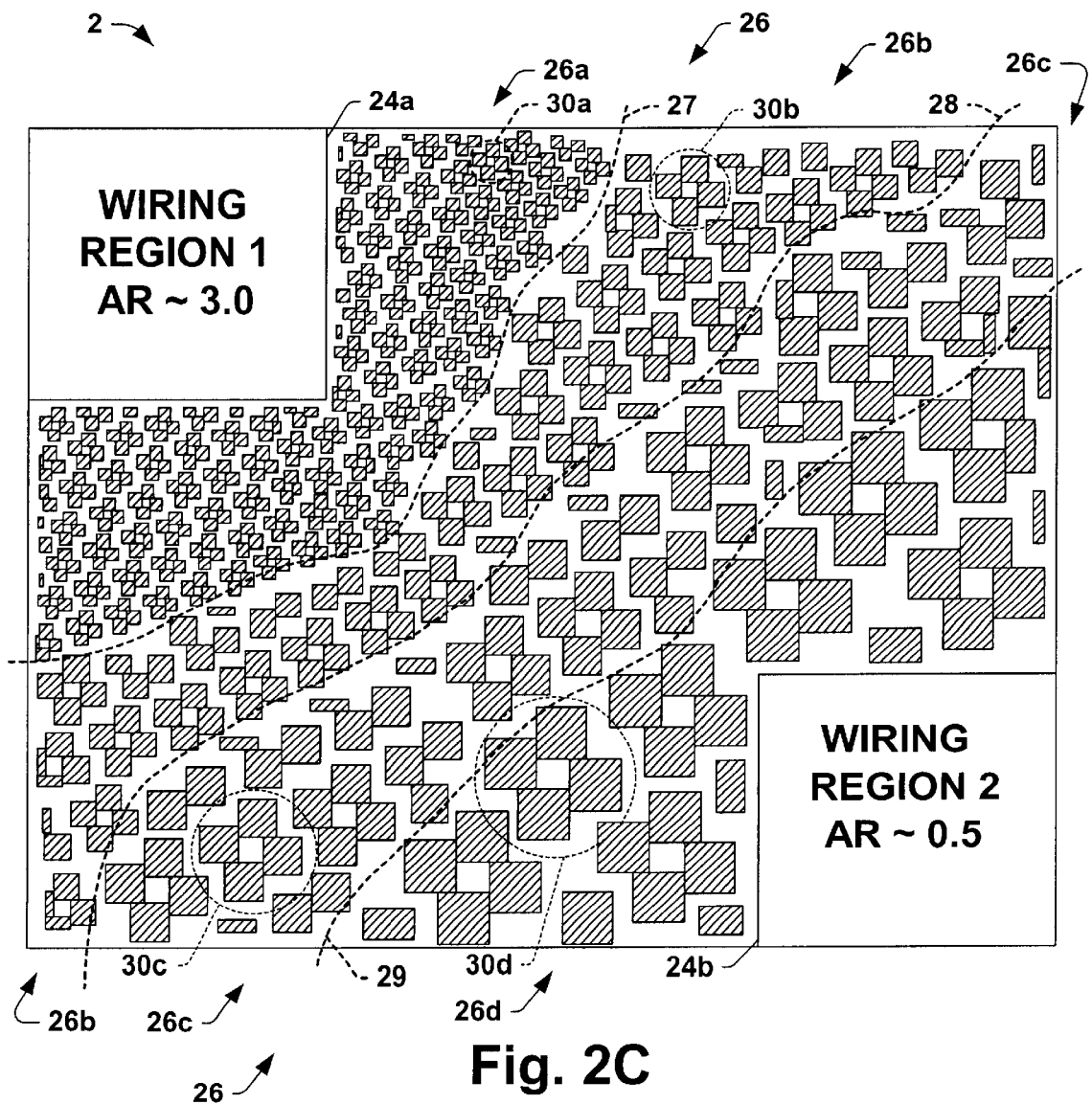
FIG. 2C is a top plan view illustrating a portion of one of the die areas in the wafer of FIGS. 2A and 2B following copper deposition and planarization, wherein the semiconductor device being fabricated comprises conductive dummy fill structures of varying sizes employed in fill regions between wiring regions in accordance with an aspect of the invention.

FIG. 2A illustrates an exemplary wafer 20 having a plurality of individual die areas 22, including a die area 22' associated with the exemplary device 2. FIG. 2B illustrates a portion of the wafer 20 including the exemplary device 2 in the die area 22', wherein the device 2 comprises various wiring regions 24 including first and second wiring regions 24a and 24b. FIG. 2C illustrates a portion of the device 2 following copper deposition and planarization during interconnect processing to form a first interconnect layer with one or more first conductive wiring structures (e.g., wiring lines, vias, etc., such as the exemplary structures 16 in FIG. 1D) having aspect ratios of about 3.0 in an insulating layer (e.g., layer 6 of FIG. 1D) of the first wiring region 24a. The illustrated portion in FIG. 2C also includes a second wiring region 24b having one or more second conductive wiring structures formed in the insulating layer (e.g., such as the structures 10 and/or 12 in FIGS. 1A and 1B) having aspect ratios of about 0.5. The wiring regions 24 include wiring structures electrically coupled with one or more electrical components (e.g., including but not limited to resistors, capacitors, inductors, transistors, diodes, etc., not shown) in the device 2 for interconnecting such components to form a desired circuit. The wiring structures in the regions 24a and 24b have heights and widths defining aspect ratios as a ratio of the height divided by the width, wherein the aspect ratio of a particular wiring structure may vary within a given interconnect layer and within a given wiring region within the scope of the invention.

The first wiring region 24a thus includes at least one conductive wiring structure having a first aspect ratio and the second wiring region 24b includes at least one conductive wiring structure having a second aspect ratio, wherein the first aspect ratio is greater than the second aspect ratio. The regions 24a and 24b, moreover, may include wiring structures of various aspect ratios (e.g., wiring lines of different widths within the region). However, a majority of the wiring structures in the region 24a are of relatively high aspect ratios, wherein the copper deposition results in overfill (e.g., as illustrated in FIGS. 1C and 1D above) in a significant portion of the region 24a, and the region 24a primary includes wiring structures used for interconnection of electrical components in the device 2. The exemplary the second wiring region 24b primarily includes lower aspect ratio wiring structures used for interconnection of electrical components in the device 2, but may also comprise one or more higher aspect ratio wiring structures. Thus, in the illustrated device 2, deposition of copper in the second wiring region 24b is primarily, if not exclusively, conformal (e.g., such as illustrated in FIGS. 1A and 1B).

The first and second wiring regions 24a and 24b are spaced from one another in the device 2, with a fill region 26 located therebetween. The exemplary fill region 26 is subdivided into fill subregions 26a, 26b, 26c, and 26d, as delineated by lines 27, 28, and 29 in FIG. 2C. The fill subregions 26a–26d are successively located between the first and second wiring regions 24a and 24b, with the first fill subregion 26a being located nearest to the first wiring region 24a and the final fill subregion 26d being nearest to the second wiring region 24b. Electrical components may, but need not be located under the interconnect layer or layers in the wiring regions 24 of the device 2. Thus, the wiring regions 24 and the intervening fill region 26 are generally representative of the locations of wiring and fill structures, respectively, and are not indicative or definitive of the positioning of electrical components in the device 2. Furthermore, as interconnection wiring structures are used to interconnect electrical components to form circuits in the device 2, the routing or wiring regions (e.g., and hence the fill regions) may be different in different layers or levels of a multi-level interconnect structure.

In accordance with one aspect of the invention, the device 2 comprises conductive dummy fill structures 30 of varying sizes employed in the fill region 26, which are electrically isolated from electrical components in the device 2. The fill structures 30 comprise conductive fill material, such as copper, aluminum, doped polysilicon, or other material which creates topology variations through overfill filling properties based at least in part on aspect ratio when deposited in an insulating layer. Referring also to FIGS. 3A–3F, the exemplary fill structures 30 comprise copper material 4 deposited in fill cavities etched in the insulating layer 6 overlying the semiconductor body 8, wherein the fill cavities are of similar depths as are trench and via cavities formed in the wiring regions 24 (e.g., having a height H as in FIGS. 3B, 3D, and 3F below). Thus, the exemplary fill structures 30 may be formed in the fill region 26 using the same processing steps used to form the wiring structures (e.g., structures 10, 12, 14, 16) in the wiring regions 24 of the device 2, although separate wiring structure and fill structure processing is possible. It is noted at this point that the fill structures and methods of the present invention may be employed in fabrication of interconnect layers directly overlying a semiconductor body 8 or electrical components thereof, as well as in forming subsequent interconnect layers. Thus, the conductive fill structures of the invention may be used in fabricating one or more upper layers in a multi-layer interconnect structure.

One or more first conductive fill structures 30a are formed in the first fill subregion 26a, individually comprising a plurality of first conductive areas 32, with the first conductive areas 32 being arranged in a first pattern having a first pattern size. The first conductive areas 32 may be of any size and shape, and need not be of the same size or shape within the scope of the invention. In the illustrated example, the exemplary first conductive areas 32a–32d are similarly sized copper squares having a size 32' of about 0.17 um, where the areas 32a–32d are arranged in a first pattern offset from a checkerboard pattern. Any pattern or patterns may be employed in forming the fill structures within the scope of the invention, wherein the illustrated patterns in the figures are merely examples. One or more second conductive fill structures 30b are formed in the next fill subregion 26b, comprising a plurality of second conductive areas 34a–34d arranged in a second pattern having a second (e.g., larger) pattern size.

In the illustrated implementation, the first and second fill structures 30a and 30b, respectively, are of the same or similar pattern, but of different pattern sizes, wherein the conductive areas 34 are of size 34' (e.g., about 0.7 um in this example). As illustrated in FIG. 3E, the largest fill patterns 30d in subregion 26d have similar pattern shapes comprising square conductive areas 36a–36d of size 36' (e.g., about 1.3 um in the device 2). However, other implementations are possible in accordance with this aspect of the invention, where the first and second fill structures 30a and 30b are of different patterns. Moreover, the fill structures 30a and 30b may be formed of conductive areas of the same or different shapes and/or sizes within the scope of the invention. In the exemplary device 2, the different fill structures 30 are generally arranged according to the fill subregions 26a–26d, although the present invention contemplates any implementation wherein two differently sized conductive fill structures are provided between wiring structures of different aspect ratios.

In the device 2, the first fill structures 30a are located between the first wiring region 24a and the second fill structures 30b, and the second fill structures 30b are located between the first fill structures 30a and the second wiring region 24b, where the successive fill subregions 26a–26d include fill structures 30a–30d of successively larger pattern sizes. In such a segmented fill implementation, any number n of such fill subregions may be provided, where n is an integer greater than 1, with a first fill subregion being located proximate the first wiring region 24a and an nth subregion (e.g., region 26d in the device 2) being located proximate the second wiring region 24b. In this case, n fill structures 30 or groups thereof are individually located in a corresponding subregion, where the pattern sizes of fill structures in different subregions are different, although the patterns of the fill structures in different subregions may be similar.

As illustrated in FIGS. 3A–3F, the degree to which the copper fill of the fill structures is conformal or overfilled changes according to the pattern size, wherein the exemplary fill structures 30a in subregion 26a (FIGS. 3A and 3B) have overfill to a copper thickness 40. A lesser degree of overfill is found for the fill structures 30b in the region 26b (FIGS. 3C and 3D), wherein the copper 4 has a thickness 42 prior to planarization, and generally conformal filling is seen in FIGS. 3E and 3F for the largest fill structures 30d in the subregion 26d, where the copper 4 has a thickness 44. In the exemplary device 2, smaller fill structures 30a are formed near the wiring region 24a which has high aspect ratio wiring structures, with successively larger fill structures 30b, 30c, and 30d being located closer to the wiring region 24b having lower aspect ratio wiring structures. In this manner, a gradual transition is provided between the overfilled and conformally filled wiring regions 24a and 24b, respectively.

In one possible implementation, the amount of overfill in the subregion 26a with the smallest fill structures 30a (e.g., the overfill thickness 40 in FIG. 3B) may be tailored to be commensurate with that of the first wiring region 24a (e.g., thicknesses T' or T" in FIGS. 1C and 1D) by selection of the pattern size, shape, etc. of the fill structures 30a. Similarly, the fill pattern size of the structures 30d in subregion 26d may be selected to match the copper thickness 44 in FIG. 3F with the conformal thickness T (FIGS. 1A and 1B) in the second wiring region 24b, with provision of one or more intermediate fill pattern sizes in the interior subregions 26b and 26c. The invention may thus be employed to facilitate improved macroscopic uniformity in deposited conductive material thickness, particularly compared with the case of no fill structures, or with fill structures of a single size and shape. Accordingly, better planarization uniformity may be achieved, for example, having less overpolish and underpolish during CMP processing. This aspect of the invention may be employed during device layout to tailor dummy metal fill for individual metal layer mask designs. Moreover, as illustrated and described below with respect to FIG. 7, one or more of the differently sized fill structures 30 in the fill region 26 may have an opening, such as a slot or other shape, in one or more of the conductive areas, which comprises insulating material of the layer 6 laterally surrounded by conductive material 4.

Figure 4:
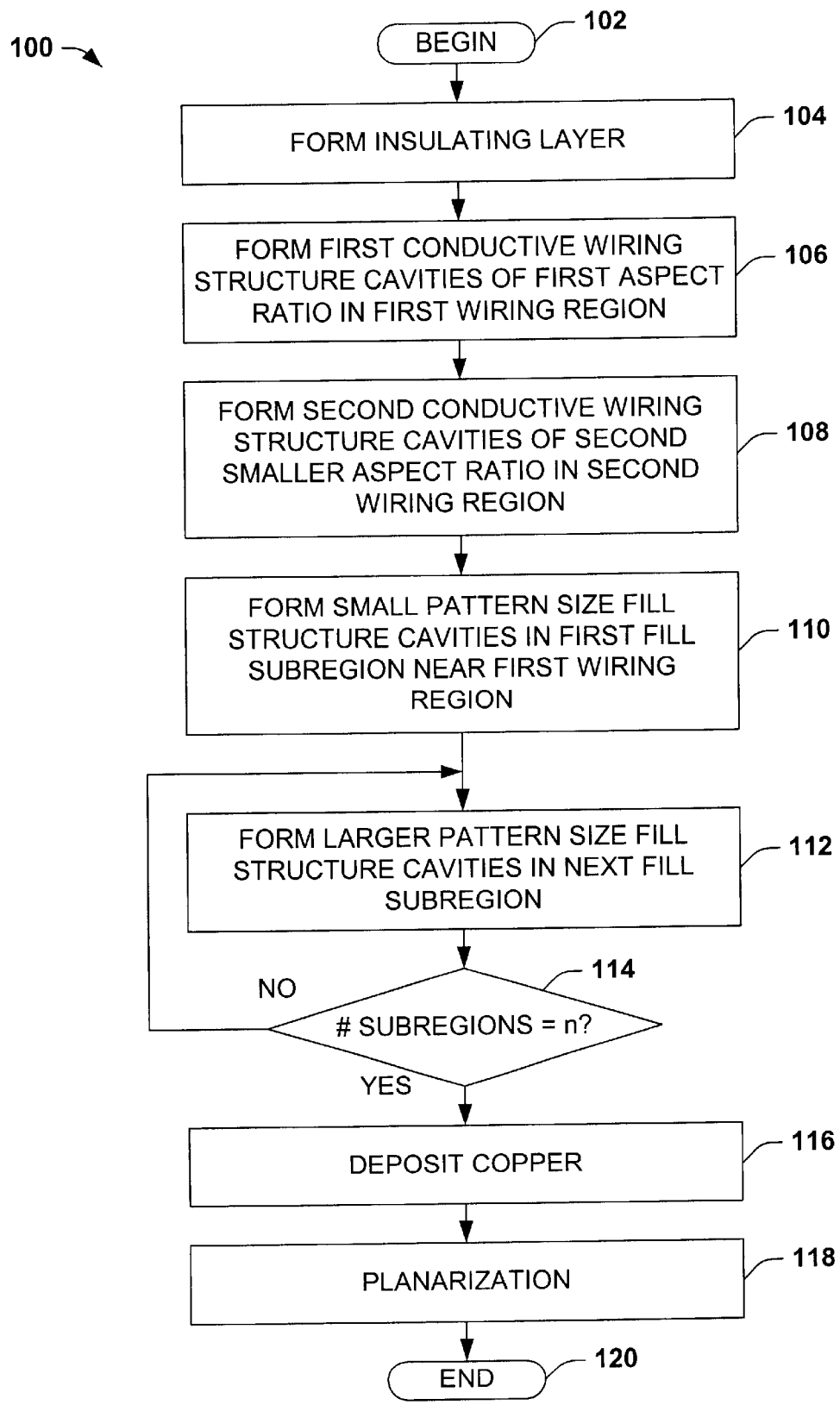
FIG. 4 is a flow diagram illustrating an exemplary method of fabricating a semiconductor device in accordance with another aspect of the invention.

FIG. 4 illustrates an exemplary method 100 for fabricating semiconductor devices in accordance with the invention, in which first and second fill structures or groups thereof are formed as patterns of conductive areas, where the sizes of the first and second patterns are different. Although the method 100 and other methods herein are illustrated and described below as a series of acts or events, the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. In one example, the exemplary method 100 and other methods in accordance with this aspect of the invention may be used in fabricating wiring or interconnect layers or levels such as that illustrated in FIG. 2C above. In this regard, the methods of the present invention may be employed in fabricating interconnect layers directly overlying a semiconductor body or electrical components thereof, as well as in forming subsequent interconnect layers, such as in the fabrication of one or more upper layers in a multi-layer interconnect structure.

Beginning at 102, the method 100 comprises forming an insulating layer over a wafer at 104, using any suitable dielectric or other insulating material and any suitable deposition technique. Thereafter at 106–112, wiring and fill structures are formed in wiring and fill regions of the insulating layer, respectively, for example, by etching recessed trench, via, and fill cavities in the insulating layer, and depositing conductive material such as copper, aluminum, or other conductive material in the cavities at 116, after which the wafer is planarized at 118. The recesses or cavities for all the wiring and fill structures may, but need not be formed at 106–112 contemporaneously by depositing a photoresist layer over the insulating layer, patterning the resist layer using suitable lithographic techniques to expose portions of the insulating layer to be etched, and etching the exposed portions to form the cavities. In this regard, the cavities may be simultaneously formed at 106, 108, 110, and 112 using a single mask and a single etch process. Thus, while these cavity formations are illustrated in FIG. 4 as different acts 106–112, the wiring and fill structure cavities of a given interconnect layer are preferably formed concurrently to minimize the number of processing steps in a manufacturing flow, although this is not a requirement of the invention. Thus, all such implementations, whether concurrent, or serial, or combinations thereof, are contemplated as falling within the scope of the present invention and the appended claims. At 106, cavities for one or more first conductive wiring structures are formed in a first wiring region of the insulating layer, comprising a first height and a first width defining a first aspect ratio. At 108, cavities for one or more second conductive wiring structures are formed in a second wiring region of the insulating layer, comprising a second height and a second width defining a second different aspect ratio.

At 110, cavities for one or more first conductive fill structures are formed in a fill region, such as a first fill subregion of the insulating layer between the first and second wiring regions. In the illustrated example, the first fill structure cavities comprise a plurality of first conductive area cavities arranged in a first pattern having a first pattern size (e.g., small pattern size cavities, such as for the structures 30a in FIG. 2C above). At 112, cavities for one or more second conductive fill structures are formed in the fill region, for example, in a second fill subregion (e.g., subregion 26b in FIG. 2C). In this example, the second fill structure cavities individually comprise a plurality of second conductive area cavities arranged in a second pattern of a second pattern size (e.g., larger pattern size cavities, such as for the structures 30b in the subregion 26b of FIG. 2C).

Any integer number n of different pattern size fill structure cavities, or groups thereof, may be formed according to the method 100, where n is an integer greater than 1. Accordingly, a determination is made at 114 as to whether fill pattern cavities for n different subregions have been formed. If not, the method 100 returns to 112, whereat cavities for even larger pattern size fill structures are formed in the insulating layer (e.g., cavities for the fill structures 30c in region 26c above). In the illustrated example of FIG. 2C, the cavity formation at 112 is then repeated again to form cavities for the large fill structures 30d in subregion 26d. As discussed above, the first and second patterns and the cavities therefor may, but need not be similar. Also, the cavities for the conductive areas forming the patterns may, but need not be of similar size and shape. Furthermore, one, some, or all of the fill structure cavities may be formed to include portions (e.g., islands) of insulating layer material, such that once filled, the resulting conductive area includes an opening comprising insulating material laterally surrounded by conductive material (e.g., FIG. 7 discussed below).

Once the desired number of differently sized fill structure cavities have been formed (e.g., YES at 114), copper or other conductive material is deposited over the wafer at 116 to fill the wiring and fill structure cavities, also covering the top surface of the insulating layer (e.g., as illustrated in FIGS. 1A–1D, 3B, 3D, and 3F above). Any number of deposition steps may be employed at 116 to fill the cavities with conductive material, which may include formation of a plurality of material layers, for example, using electrochemical deposition (ECD) techniques preceded by formation of appropriate diffusion barrier and copper seed layers. The wafer is then planarized at 118 using any suitable process, for example, such as chemical mechanical polishing (CMP), after which the method 100 ends at 120.

Referring now to FIGS. 5 and 6A–6F, another aspect of the invention involves the provision of conductive fill structures with varying amounts of openings. In one example, the fill structures comprise conductive areas formed into patterns, wherein one or more of the conductive areas include slot shaped openings comprising insulating material surrounded by conductive material of the fill structure, although other fill structures and opening sizes and/or shapes may be employed within the scope of the invention. This aspect of the invention provides the possibility of selective provision of conductive fill structures with varying numbers, sizes, and/or shapes of openings to facilitate a gradual transition between overfilled and conformally filled wiring regions. This, in turn, may facilitate reduction in surface topology variations following planarization. For example, fill structures having few or no openings may be provided near low aspect ratio wiring structures while fill structures having more openings are located near higher aspect ratio wiring structures. This aspect of the invention is illustrated and described further below in conjunction with the exemplary semiconductor device 2, wherein similarly numbered items are as described above.

Figure 5:
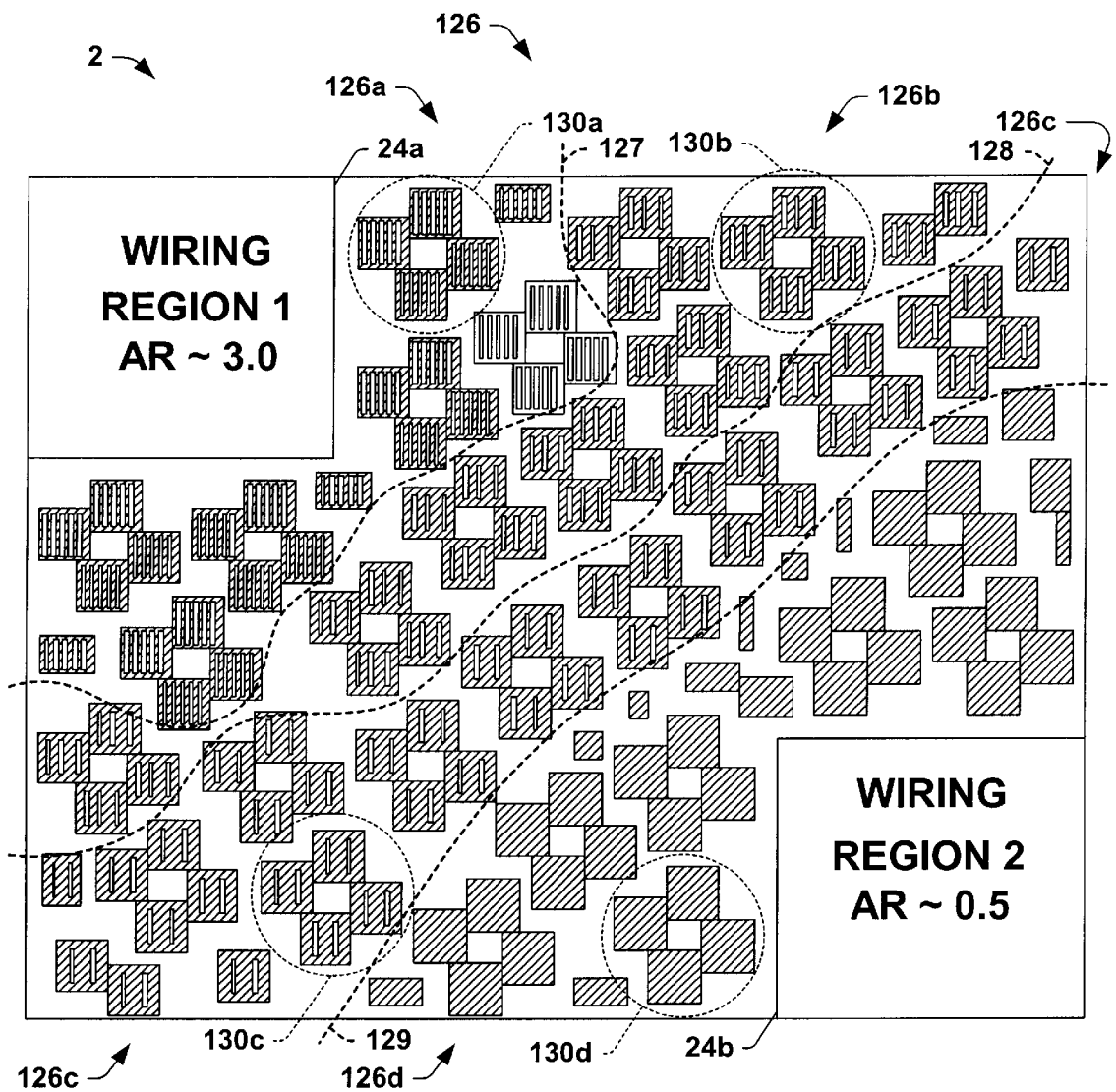
FIG. 5 is a top plan view illustrating a portion of the exemplary semiconductor device following copper deposition and planarization, comprising conductive dummy fill structures with varying numbers of openings in fill regions between wiring regions in accordance with yet another aspect of the invention.

As illustrated in FIG. 5, a fill region 126 is located between the first and second wiring regions 24a and 24b in the device 2, where the exemplary fill region 126 is subdivided into fill subregions 126a, 126b, 126c, and 126d, as delineated by lines 127, 128, and 129, with the first fill subregion 126a being located nearest to the first wiring region 24a and the final fill subregion 126d being nearest to the second wiring region 24b. The device 2 comprises conductive dummy fill structures 130 with varying amounts of openings, which are electrically isolated from electrical components in the device 2. The fill structures 130 comprise conductive fill material 4, such as copper, aluminum, doped polysilicon, or other material formed in cavities of the insulating layer 6, some of which include one or more openings comprising islands of insulating material 6 surrounded by copper 4. One or more first conductive fill structures 130a are formed in the first fill subregion 126a, individually comprising a plurality of generally square first conductive areas 132a–132d (FIGS. 6A and 6B) of length 132' (e.g., about 1.3 um in the illustrated example), wherein the first conductive areas 132 are arranged in a pattern having a first pattern size. The first conductive areas 132 may be of any size and shape, and need not be of the same size or shape within the scope of the invention. Furthermore, any pattern or patterns may be employed in forming the fill structures within the scope of the invention, wherein the illustrated patterns in the figures are merely examples.

In the first fill structures 130a, each of the conductive areas 132 comprises 5 slot shaped openings 138 individually comprising insulating material of the layer 6 laterally surrounded by conductive material 4. However, all of the conductive areas 132 need not include openings 138, and different numbers of openings may be provided in different conductive areas 132 within the scope of the invention. Further, the openings need not be of similar size or shape, wherein openings of different sizes and/or shapes may be provided in different conductive areas 132 or in the same conductive areas 132 in accordance with the invention.

Figure 6A:
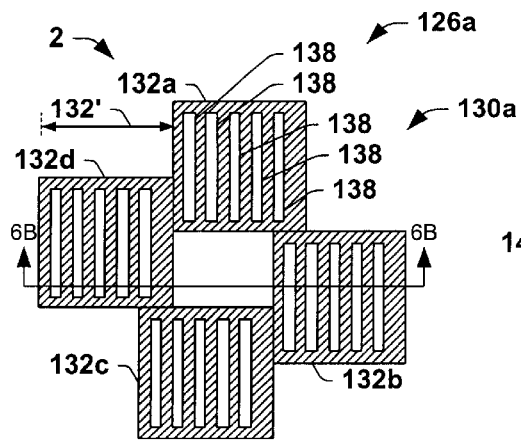
FIG. 6A is a top plan view illustrating an exemplary first conductive fill structures of the device of FIG. 5, having several openings.
Figure 6B:
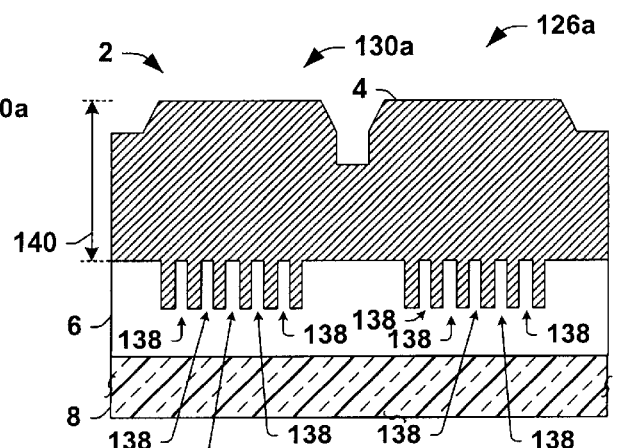
FIG. 6B is a partial side elevation view in section taken along line 6B—6B in FIG. 6A illustrating significant copper overfill near the exemplary first fill structure prior to planarization.
Figure 6C:
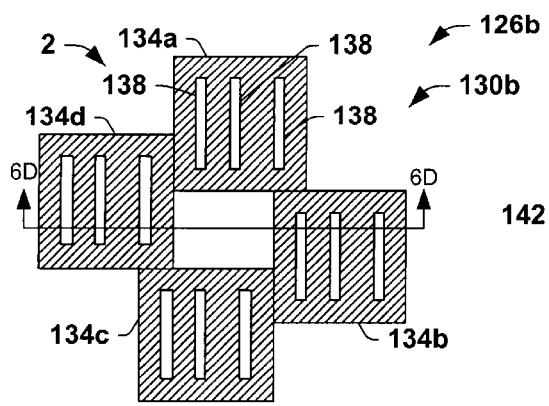
FIG. 6C is a top plan view illustrating an exemplary second conductive fill structure of the device of FIG. 5, having a smaller number of openings than the fill structure of FIG. 6A.
Figure 6D:
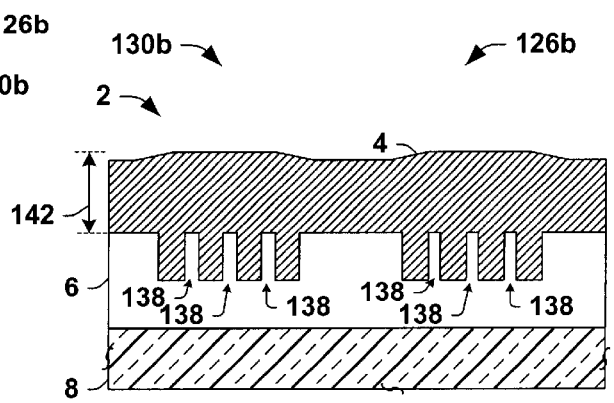
FIG. 6D is a partial side elevation view in section taken along line 6D—6D in FIG. 6C illustrating a lesser degree of overfill near the exemplary second fill structure prior to planarization.

One or more second conductive fill structures 130b are formed in the second fill subregion 126b, comprising a plurality of second conductive areas 134a–134d arranged in a similar second pattern of similar pattern size (FIGS. 6C and 6D). The conductive areas 134 individually comprise three slot shaped openings 138, similar to those formed in the first conductive areas 132. In the third subregion 126c, third fill structures 130c of similar pattern and pattern size are formed, comprising conductive areas including two similarly sized slot openings. In the last subregion 126d, fill structures 130d (FIGS. 6E and 6F) are formed, where the individual conductive areas 136 thereof have no openings. Other implementations are possible in accordance with this aspect of the invention, where the first and second fill structures 130a and 130b are of different patterns. Moreover, the fill structures 130a and 130b may be formed of conductive areas of the same or different shapes, and of the same or different sizes within the scope of the invention. In addition, the openings in the fill structures 130a and 130b may be of different sizes and/or of different shapes. In the exemplary device 2, the different fill structures 130 are generally arranged according to the fill subregions 126a–126d, although the present invention contemplates any implementation wherein two conductive fill structures having different numbers, sizes, and/or shapes of openings are provided between wiring structures of different aspect ratios.

In the device 2, the first fill structures 130a are located between the first wiring region 24a and the second fill structures 130b are located between the first fill structures 130a and the second wiring region 24b, where the successive fill subregions 126a–126d include fill structures 130a–130d of successively fewer openings. Any number n of such fill subregions may be provided, with a first fill subregion being located proximate the first wiring region 24a and an nth subregion (e.g., region 126d in the device 2) being located proximate the second wiring region 24b. In this case, where n fill structures 130 or groups thereof are individually located in a corresponding subregion, the amount of openings 138 of fill structures 130 in different subregions may be different, although the patterns and pattern sizes of the fill structures 130 in different subregions may, but need not be similar.

Figure 6E:
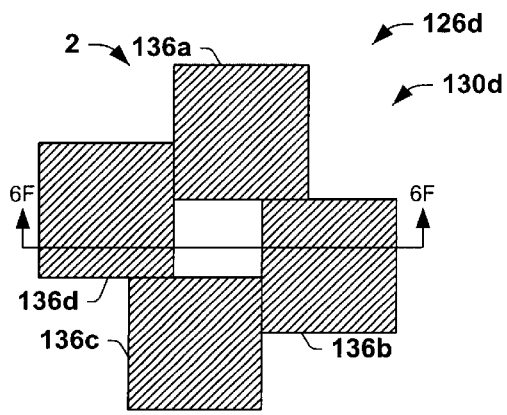
FIG. 6E is a top plan view illustrating another exemplary conductive fill structure of the device of FIG. 5, having no openings.
Figure 6F:
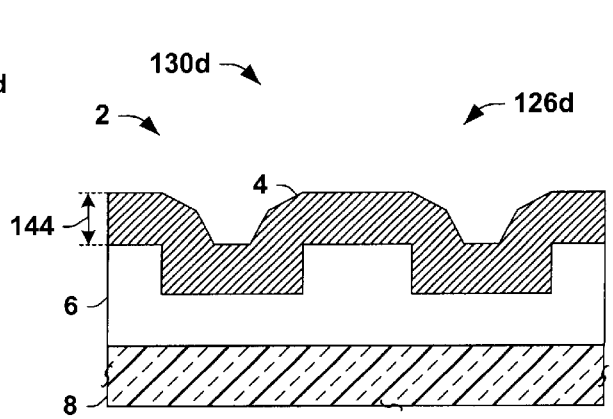
FIG. 6F is a partial side elevation view in section taken along line 6F—6F in FIG. 6E illustrating generally conformal copper fill near the exemplary fill structure of FIG. 6E prior to planarization.

As illustrated in FIGS. 6A–6F, the degree to which the copper fill of the fill structures is conformal or overfilled may be adjusted according to the number, size, and/or shape of the openings in the conductive fill structures 130. In this regard, the exemplary fill structures 130a in subregion 126a (FIGS. 6A and 6B) have significant copper overfill to a thickness 140. Lesser copper overfill is found for the fill structures 130b of a lesser number of slot openings 138 in the region 126b (FIGS. 6C and 6D), wherein the copper 4 has a thickness 142 prior to planarization. More conformal filling is seen in FIGS. 6E and 6F for the fill structures 130d having no openings in the subregion 126d, where the copper 4 has a thickness 144.

In the exemplary device 2, fill structures 130a having the most openings 138 are formed near the wiring region 24a which has high aspect ratio wiring structures, with fill structures 130b, 130c, and 130d of successively fewer openings 138 being located closer to the second wiring region 24b. In this manner, a gradual transition is provided in the fill region 126 between the overfilled and conformally filled wiring regions 24a and 24b, respectively. In the exemplary device 2, the amount of overfill in the subregion 126a (e.g., the overfill thickness 140 in FIG. 6B) may thus be tailored to that of the first wiring region 24a(e.g., thicknesses T' or T" in FIGS. 1C and 1D), and the fill patterns 130d in the subregion 126d may be selected to match the copper thickness 144 in FIG. 6F with the conformal thickness T (FIGS. 1A and 1B) in the second wiring region 24b, with gradual adjustment in the amount of overfill (e.g., thickness 142 in FIG. 6D) in the interior subregions 126b and 126c.

Figure 7:
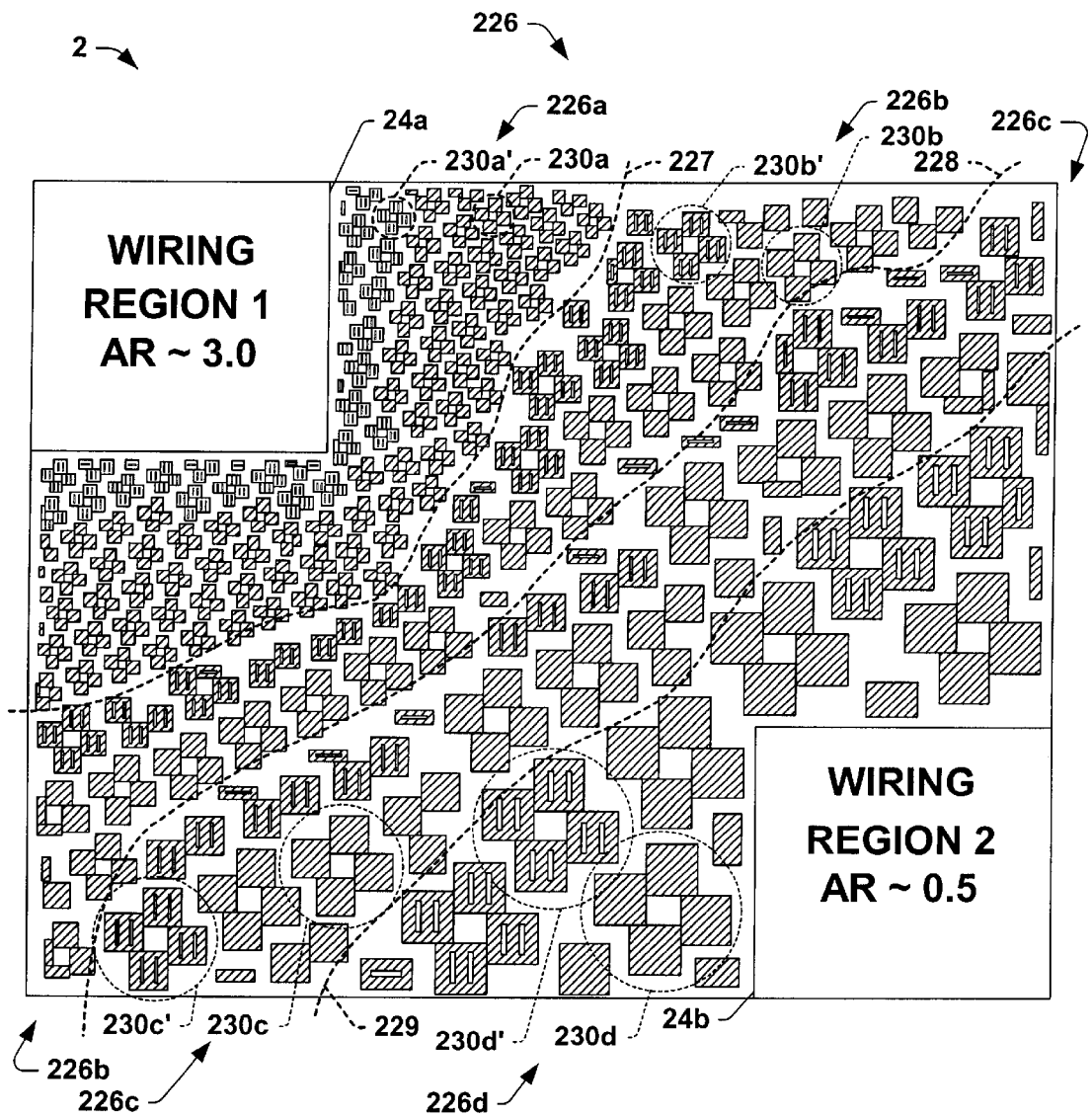
FIG. 7 is a top plan view illustrating a portion of another exemplary semiconductor device following copper deposition and planarization, comprising conductive dummy fill structures of various pattern sizes and with varying numbers of openings in fill regions between wiring regions in accordance with the invention.

Referring also to FIG. 7, the above described fill techniques may be employed in combination, wherein fill structures 230 of different pattern sizes in a fill region 226 may have different amounts of openings. As with the above examples, the fill region 226 is located between the first and second wiring regions 24a and 24b and is subdivided into fill subregions 226a, 226b, 226c, and 226d, as delineated by lines 227, 228, and 229, where the first fill subregion 226a is located nearest to the first wiring region 24a and the final fill subregion 226d is nearest to the second wiring region 24b. Conductive dummy fill structures 230 are provided in the fill region 226, having different pattern sizes and varying amounts of openings. A plurality of (small) first conductive fill structures 230a and 230a' are formed in the first fill subregion 226a, wherein the structures 230a' nearest the wiring region 24a include openings and the structures 230a have fewer (e.g., zero) openings. In the second subregion 226b, second conductive fill structures 230b' and 230b of slightly larger pattern size are provided, wherein the structures 230b' closest to the first subregion 226a have openings and the other structures 230b (e.g., closest to the third subregion 226c) have fewer openings.

Similarly, still larger fill structures 230c and 230c' are provided in the third subregion 226c, some (e.g., structures 230c') having openings, and some having no openings (e.g., structures 230c). In the last subregion 226d, large structures 230d' are provided having openings therein, and large pattern sized structures 230d having no openings are provided closest to the second wiring region 24b. Other implementations are possible in accordance with the invention, where the fill structures 230 are of different or similar patterns, different or similar conductive area sizes and/or shapes, different or similar numbers, sizes, and/or shapes of openings, conductive areas of the same or different shapes and/or sizes within the scope of the invention.

Figure 8:
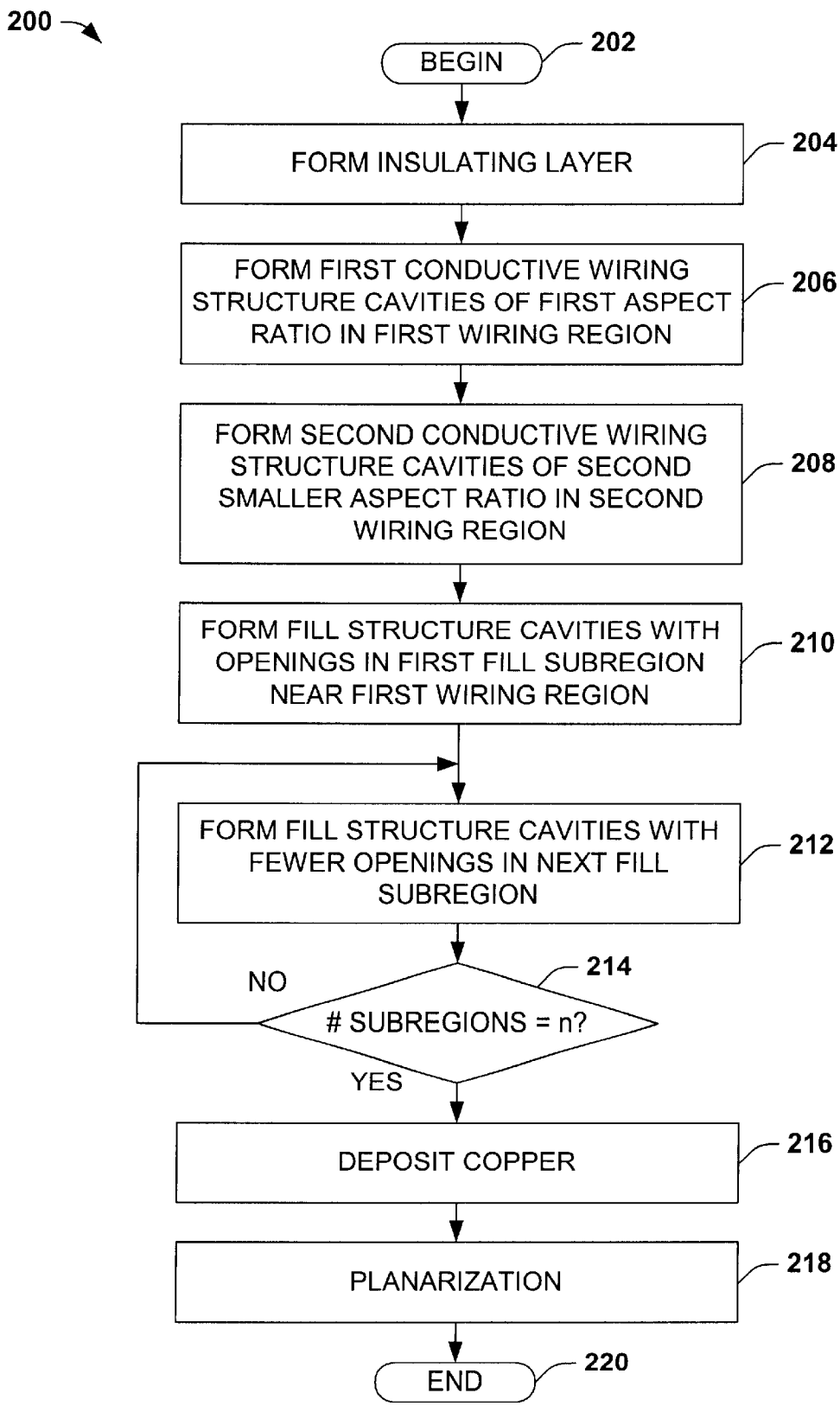
FIG. 8 is a flow diagram illustrating another exemplary method of fabricating a semiconductor device in accordance with the invention.

FIG. 8 illustrates another exemplary method 200 for fabricating semiconductor devices in accordance with the invention, wherein first and second fill structures or groups thereof are formed as patterns of conductive areas. In this aspect of the invention, a first conductive fill structure comprises an opening, and a second conductive fill structure is formed having a different number of openings than the first conductive fill structure (e.g., as shown in FIGS. 5 and 7). As with the above examples, the method 200 and other methods according to this aspect of the invention may be employed in fabricating interconnect layers directly overlying a semiconductor body or electrical components thereof, as well as in forming subsequent interconnect layers, such as in the fabrication of one or more upper layers in a multilayer interconnect structure. Beginning at 202, the method 200 comprises forming an insulating layer (e.g., layer 106 above) over a wafer at 204, and forming cavities for wiring and fill structures in the insulating layer at 206–212. As with the above method 100 of FIG. 4, the cavities in the method 200 may be simultaneously formed at 206, 208, 210, and 212 using a single mask and a single etch process, for example, to minimize the number of processing steps in a manufacturing flow. In this respect, all such implementations of the method 200, whether concurrent, or serial, or combinations thereof, are contemplated as falling within the scope of the invention. The cavities are filled with copper at 216 and the wafer is planarized at 218 before the method 200 ends at 220. At 206, cavities for one or more first conductive wiring structures are formed in a first wiring region of the insulating layer, comprising a first height and a first width defining a first aspect ratio. At 208, cavities for one or more second conductive wiring structures are formed in a second wiring region of the insulating layer, comprising a second height and a second width defining a second aspect ratio.

At 210, cavities for one or more first conductive fill structures (e.g., structures (e.g., structures 130a in FIGS. 5 and 6A) are formed in a fill region (e.g., first fill subregion 126a in FIG. 5 above) between the first and second wiring regions, comprising one or more openings (e.g., openings 138 in FIG. 6A). At 212, cavities for one or more second conductive fill structures (e.g., structures 130b in FIG. 5) are formed in the fill region, for example, in a second fill subregion (e.g., subregion 126b in FIG. 5). The second fill structure cavities individually comprise fewer openings than in the first fill structures.

Any integer number n of fill structure cavities, or groups thereof, may be formed according to the method 200, with fewer and fewer openings. A determination is made at 214 as to whether fill pattern cavities for n different subregions have been formed. If not (e.g., NO at 214), the method 200 returns to 212, whereat cavities for fill structures having still fewer openings are formed in the insulating layer (e.g., cavities for the fill structures 130c in region 126c of FIG. 5). The cavity formation at 212 may again be repeated to form cavities for final fill structures 130d in the fill subregion 126d, having no openings. Once the desired number of fill structure cavities with successively fewer openings have been formed (e.g., YES at 214), copper or other conductive material is deposited over the wafer at 216 to fill the wiring and fill structure cavities, which also covers the top surface of the insulating layer. The wafer is then planarized at 218, for example, using CMP techniques, after which the method 200 ends at 220.

Still another aspect of the invention provides fill structures formed in a semiconductor body between isolation regions (e.g., such as STI isolation regions), where the fill structures are of varying pattern sizes and/or varying numbers or types of openings, using any of the above described fill techniques. In one implementation, the fill structures may be formed during shallow trench isolation (STI) isolation structure formation, to improve or facilitate CMP planarization following trench fill operations. A first isolation structure is formed in a first isolation region of the semiconductor body, and a second isolation structure is formed in a second isolation region of the semiconductor body. A first fill structure is provided in the semiconductor body between the first and isolation regions, which comprises a plurality of first fill areas arranged in a first pattern having a first pattern size. A second fill structure is formed in the semiconductor body between the first and isolation regions, comprising a plurality of second fill areas arranged in a second pattern having a second pattern size, where the first and second pattern sizes are different.

As with the above-illustrated interconnect layer fill structures, the isolation fill structures may facilitate planarization following STI trench fill, wherein the first and second patterns may, but need not be, similar. Moreover, as discussed above in connection with FIGS. 5 and 7, one, some, or all of the fill structures may have openings. For instance, one or more of the first fill areas may have an opening comprising material of the semiconductor body laterally surrounded by material of the at least one of the first fill areas. In another aspect of the invention, such isolation fill structures may be of similar pattern, pattern size, shape, etc., where certain fill structures have more openings than others. For example, the semiconductor device may comprise a plurality of fill structures formed in the semiconductor body between the first and second isolation regions, where a first fill structure has an opening, which comprises material of the semiconductor body laterally surrounded by material of the first fill structure. The device in this example also includes a second fill structure having a different number of openings than the first fill structure.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A semiconductor device, comprising:
   an insulating layer located over a semiconductor body;
   a first conductive wiring structure formed in a first wiring region of the insulating layer, the first conductive wiring structure being electrically coupled with at least one electrical component in the device, the first conductive wiring structure comprising a first height and a first width defining a first aspect ratio as a ratio of the first height over the first width;
   a second conductive wiring structure formed in a second wiring region of the insulating layer, the first and second wiring regions being spaced from one another, the second conductive wiring structure being electrically coupled with at least one electrical component in the device, the second conductive wiring structure comprising a second height and a second width defining a second aspect ratio as a ratio of the second height over the second width, the first aspect ratio being greater than the second aspect ratio;
   a first conductive fill structure formed in a fill region of the insulating layer, the fill region being between the first and second wiring regions, the first conductive fill structure being electrically isolated from electrical components in the device, the first fill structure comprising a plurality of first conductive areas, the first conductive areas being arranged in a first pattern having a first pattern size; and
   a second conductive fill structure formed in the fill region, the second conductive fill structure being electrically isolated from electrical components in the device, the second fill structure comprising a plurality of second conductive areas, the second conductive areas being arranged in a second pattern having a second pattern size, the first and second pattern sizes being different.

2. The device of claim 1, wherein the first and second patterns are similar.

3. The device of claim 2, wherein the plurality of first conductive areas are of similar shape, and wherein the plurality of second conductive areas are of similar shape.

4. The device of claim 3, wherein the plurality of first conductive areas are of similar size, and wherein the plurality of second conductive areas are of similar size.

5. The device of claim 4, wherein the first and second conductive areas are of similar shape.

6. The device of claim 3, wherein the first and second conductive areas are of similar shape.

7. The device of claim 2, wherein the plurality of first conductive areas are of similar size, and wherein the plurality of second conductive areas are of similar size.

8. The device of claim 2, wherein the second pattern size is larger than the first pattern size, wherein the first conductive fill structure is located between the first conductive wiring region and the second conductive fill structure, and wherein the second conductive fill structure is located between the first conductive fill structure and the second conductive wiring region.

9. The device of claim 8, wherein the first and second conductive areas are of similar shape.

10. The device of claim 8, wherein at least one of the first conductive areas has an opening comprising insulating material of the insulating layer laterally surrounded by conductive material of the at least one of the first conductive areas.

11. The device of claim 10, wherein at least one of the second conductive areas has an opening comprising insulating material of the insulating layer laterally surrounded by conductive material of the at least one of the second conductive areas.

12. The device of claim 8, wherein at least one of the second conductive areas has an opening comprising insulating material of the insulating layer laterally surrounded by conductive material of the at least one of the second conductive areas.

13. The device of claim 8, wherein the fill region comprises n fill subregions between the first and second wiring regions, n being an integer number greater than 1, with a first fill subregion being located proximate the first wiring region and an nth fill subregion being located proximate the second wiring region, the semiconductor device comprising n conductive fill structures individually located in a corresponding one of the n fill subregions and being electrically isolated from electrical components in the device, the individual conductive fill structures comprising a plurality of conductive areas arranged in a pattern having a pattern size, wherein the pattern sizes of conductive fill structures in different fill subregions are different, and wherein the patterns of conductive fill structures in different fill subregions are similar.

14. The device of claim 13, wherein the pattern size of the conductive fill structure in the first fill subregion is smaller than the remaining pattern sizes, wherein the pattern sizes of the conductive fill structures in adjacent fill subregions are successively larger between the first and the nth fill subregions, and wherein the pattern size of the conductive fill structure in the nth subregion is larger than the remaining pattern sizes.

15. The device of claim 2, wherein at least one of the first conductive areas has an opening comprising insulating material of the insulating layer laterally surrounded by conductive material of the at least one of the first conductive areas.

16. The device of claim 15, wherein at least one of the second conductive areas has an opening comprising insulating material of the insulating layer laterally surrounded by conductive material of the at least one of the second conductive areas.

17. The device of claim 2, wherein at least one of the second conductive areas has an opening comprising insulating material of the insulating layer laterally surrounded by conductive material of the at least one of the second conductive areas.

18. The device of claim 2, wherein the fill region comprises n fill subregions between the first and second wiring regions, n being an integer number greater than 1, with a first fill subregion being located proximate the first wiring region and an nth fill subregion being located proximate the second wiring region, the semiconductor device comprising n conductive fill structures individually located in a corresponding one of the n fill subregions and being electrically isolated from electrical components in the device, the individual conductive fill structures comprising a plurality of conductive areas arranged in a pattern having a pattern size, wherein the pattern sizes of conductive fill structures in different fill subregions are different, and wherein the patterns of conductive fill structures in different fill subregions are similar.

19. The device of claim 18, wherein the pattern size of the conductive fill structure in the first fill subregion is smaller than the remaining pattern sizes, wherein the pattern sizes of the conductive fill structures in adjacent fill subregions are successively larger between the first and the nth fill subregions, and wherein the pattern size of the conductive fill structure in the nth subregion is larger than the remaining pattern sizes.

20. The device of claim 2, wherein the first and second conductive areas are of similar shape.

21. A method of fabricating a semiconductor device in a wafer, comprising:

forming an insulating layer over the wafer;

forming a first conductive wiring structure in a first wiring region of the insulating layer, the first conductive wiring structure being electrically coupled with at least one electrical component in the device, the first conductive wiring structure comprising a first height and a first width defining a first aspect ratio as a ratio of the first height over the first width;

forming a second conductive wiring structure in a second wiring region of the insulating layer, the first and second wiring regions being spaced from one another, the second conductive wiring structure being electrically coupled with at least one electrical component in the device, the second conductive wiring structure comprising a second height and a second width defining a second aspect ratio as a ratio of the second height over the second width;

forming a first conductive fill structure in a fill region of the insulating layer between the first and second wiring regions, the first conductive fill structure being electrically isolated from electrical components in the device, the first fill structure comprising a plurality of first conductive areas, the first conductive areas being arranged in a first pattern having a first pattern size; and forming a second conductive fill structure in the fill region, the second conductive fill structure being electrically isolated from electrical components in the device, the second fill structure comprising a plurality of second conductive areas, the second conductive areas being arranged in a second pattern having a second pattern size, the first and second pattern sizes being different.

22. The method of claim 21, wherein the first and second patterns are similar.

23. The method of claim 21, wherein the plurality of first conductive areas are of similar shape, and wherein the plurality of second conductive areas are of similar shape.

24. The method of claim 23, wherein the plurality of first conductive areas are of similar size, and wherein the plurality of second conductive areas are of similar size.

25. The method of claim 21, wherein the first and second conductive areas are of similar shape.

26. The method of claim 21, wherein the second pattern size is larger than the first pattern size, wherein the first conductive fill structure is located between the first conductive wiring region and the second conductive fill structure, and wherein the second conductive fill structure is located between the first conductive fill structure and the second conductive wiring region.

27. The method of claim 21, wherein at least one of the first conductive areas has an opening comprising insulating material of the insulating layer laterally surrounded by conductive material of the at least one of the first conductive areas.

28. The method of claim 21, wherein at least one of the second conductive areas has an opening comprising insulating material of the insulating layer laterally surrounded by conductive material of the at least one of the second conductive areas.

29. The method of claim 21, wherein the fill region comprises n fill subregions between the first and second wiring regions, n being an integer number greater than 1, with a first fill subregion being located proximate the first wiring region and an nth fill subregion being located proximate the second wiring region, the method comprising forming n conductive fill structures individually located in a corresponding one of the n fill subregions and being electrically isolated from electrical components in the device, the individual conductive fill structures comprising a plurality of conductive areas arranged in a pattern having a pattern size, wherein the pattern sizes of conductive fill structures in different fill subregions are different, and wherein the patterns of conductive fill structures in different fill subregions are similar.

30. The method of claim 29, wherein the pattern size of the conductive fill structure in the first fill subregion is smaller than the remaining pattern sizes, wherein the pattern sizes of the conductive fill structures in adjacent fill subregions are successively larger between the first and the nth fill subregions, and wherein pattern size of the conductive fill structure in the nth subregion is larger than the remaining pattern sizes.

31. A semiconductor device, comprising:

an insulating layer located over a semiconductor body;

a first conductive wiring structure formed in a first wiring region of the insulating layer, the first conductive wiring structure being electrically coupled with at least one electrical component in the device, the first conductive wiring structure comprising a first height and a first width defining a first aspect ratio as a ratio of the first height over the first width;

a second conductive wiring structure formed in a second wiring region of the insulating layer, the first and second wiring regions being spaced from one another, the second conductive wiring structure being electrically coupled with at least one electrical component in the device, the second conductive wiring structure comprising a second height and a second width defining a second aspect ratio as a ratio of the second height over the second width, the first aspect ratio being greater than the second aspect ratio; and a plurality of conductive fill structures formed in a fill region of the insulating layer, the fill region being between the first and second wiring regions, the conductive fill structures being electrically isolated from electrical components in the device, a first conductive fill structure comprising an opening, the opening comprising insulating material of the insulating layer laterally surrounded by conductive material of the one of the first and second conductive fill structures, and a second conductive fill structure having a different number of openings than the first conductive fill structure.

32. The device of claim 31, wherein the first fill structure comprises a plurality of first conductive areas arranged in a first pattern having a first pattern size, and wherein the second fill structure comprises a plurality of second conductive areas arranged in a second pattern having a second pattern size.

33. The device of claim 32, wherein the first and second pattern sizes are similar.

34. The device of claim 33, wherein the first and second patterns are similar.

35. The device of claim 32, wherein the first and second patterns are similar.

36. The device of claim 32, wherein the plurality of first conductive areas are of similar size, and wherein the plurality of second conductive areas are of similar size.

37. The device of claim 36, wherein the first and second conductive areas are of similar size.

38. The device of claim 32, wherein the first and second conductive areas are of similar shape.

39. The device of claim 32, wherein the fill region comprises n fill subregions between the first and second wiring regions, n being an integer number greater than 1, with a first fill subregion being located proximate the first wiring region and an nth fill subregion being located proximate the second wiring region, the semiconductor device comprising n conductive fill structures individually located in a corresponding one of the n fill subregions and being electrically isolated from electrical components in the device, at least two of the individual conductive fill structures comprising different numbers of openings.

40. The device of claim 39, the individual conductive fill structures comprising a plurality of conductive areas arranged in a pattern having a pattern size, the pattern sizes and shapes of conductive fill structures in different fill subregions being similar.

41. The device of claim 39, the individual conductive fill structures comprising a plurality of conductive areas arranged in a pattern having a pattern size, the pattern sizes of conductive fill structures in different fill subregions being different.

42. The device of claim 41, wherein the pattern size of the conductive fill structure in the first fill subregion is smaller than the remaining pattern sizes, wherein the pattern sizes of the conductive fill structures in adjacent fill subregions are successively larger between the first and the nth fill subregions, and wherein the pattern size of the conductive fill structure in the nth subregion is larger than the remaining pattern sizes.

43. The device of claim 42, wherein the number of openings in the conductive fill structure in the first fill subregion is larger the number of openings in the conductive fill structures in the remaining fill subregions, wherein the number of openings in the conductive fill structures in adjacent fill subregions are successively smaller between the first and the nth fill subregions, and wherein the number of openings in the conductive fill structure in the nth subregion is smaller than in the other conductive fill structures.

44. The device of claim 39, wherein the number of openings in the conductive fill structure in the first fill subregion is larger the number of openings in the conductive fill structures in the remaining fill subregions, wherein the number of openings in the conductive fill structures in adjacent fill subregions are successively smaller between the first and the nth fill subregions, and wherein the number of openings in the conductive fill structure in the nth subregion is smaller than in the other conductive fill structures.

45. A method of fabricating a semiconductor device in a wafer, comprising:

forming an insulating layer over the wafer;

forming a first conductive wiring structure in a first wiring region of the insulating layer, the first conductive wiring structure being electrically coupled with at least one electrical component in the device, the first conductive wiring structure comprising a first height and a first width defining a first aspect ratio as a ratio of the first height over the first width;

forming a second conductive wiring structure in a second wiring region of the insulating layer, the first and second wiring regions being spaced from one another, the second conductive wiring structure being electrically coupled with at least one electrical component in the device, the second conductive wiring structure comprising a second height and a second width defining a second aspect ratio as a ratio of the second height over the second width, the first aspect ratio being greater than the second aspect ratio; and forming a plurality of conductive fill structures in a fill region of the insulating layer, the fill region being between the first and second wiring regions, the conductive fill structures being electrically isolated from electrical components in the device, a first conductive fill structure comprising an opening, the opening comprising insulating material of the insulating layer laterally surrounded by conductive material of the one of the first and second conductive fill structures, and a second conductive fill structure having a different number of openings than the first conductive fill structure.

46. The method of claim 45, wherein forming the first fill structure comprises forming a plurality of first conductive areas arranged in a first pattern having a first pattern size, and wherein forming the second fill structure comprises forming a plurality of second conductive areas arranged in a second pattern having a second pattern size.

47. The method of claim 46, wherein the first and second pattern sizes are similar.

48. The method of claim 46, wherein the first and second patterns are similar.

49. The method of claim 46, wherein the plurality of first conductive areas are of similar size, and wherein the plurality of second conductive areas are of similar size.

50. The method of claim 49, wherein the first and second conductive areas are of similar size.

51. The method of claim 46, wherein the first and second conductive areas are of similar shape.

52. The method of claim 46, wherein the fill region comprises n fill subregions between the first and second wiring regions, n being an integer number greater than 1, with a first fill subregion being located proximate the first wiring region and an nth fill subregion being located proximate the second wiring region, the method comprising forming n conductive fill structures individually located in a corresponding one of the n fill subregions and being electrically isolated from electrical components in the device, at least two of the individual conductive fill structures comprising different numbers of openings.

53. The method of claim 52, wherein forming the individual conductive fill structures comprises forming a plurality of conductive areas arranged in a pattern having a pattern size, the pattern sizes and shapes of conductive fill structures in different fill subregions being similar.

54. The method of claim 52, wherein the pattern sizes of conductive fill structures in different fill subregions are different.

55. The method of claim 54, wherein the pattern size of the conductive fill structure in the first fill subregion is smaller than the remaining pattern sizes, wherein the pattern sizes of the conductive fill structures in adjacent fill subregions are successively larger between the first and the nth fill subregions, and wherein the pattern size of the conductive fill structure in the nth subregion is larger than the remaining pattern sizes.

56. The method of claim 55, wherein the number of openings in the conductive fill structure in the first fill subregion is larger the number of openings in the conductive fill structures in the remaining fill subregions, wherein the number of openings in the conductive fill structures in adjacent fill subregions are successively smaller between the first and the nth fill subregions, and wherein the number of openings in the conductive fill structure in the nth subregion is smaller than in the other conductive fill structures.

57. The method of claim 52, wherein the number of openings in the conductive fill structure in the first fill subregion is larger the number of openings in the conductive fill structures in the remaining fill subregions, wherein the number of openings in the conductive fill structures in adjacent fill subregions are successively smaller between the first and the nth fill subregions, and wherein the number of openings in the conductive fill structure in the nth subregion is smaller than in the other conductive fill structures.

58. A semiconductor device, comprising:

a first isolation structure formed in a first isolation region of a semiconductor body;

a second isolation structure formed in a second isolation region of the semiconductor body;

a first fill structure formed in the semiconductor body between the first and second isolation regions and comprising a plurality of first fill areas, the first fill areas being arranged in a first pattern having a first pattern size; and a second fill structure formed in the semiconductor body between the first and second isolation regions and comprising a plurality of second fill areas, the second fill areas being arranged in a second pattern having a second pattern size, the first and second pattern sizes being different.

59. The device of claim 58, wherein the first and second patterns are similar.

60. The device of claim 59, wherein the second pattern size is larger than the first pattern size, wherein the first fill structure is located between the first isolation region and the second fill structure, and wherein the second fill structure is located between the first fill structure and the second isolation region.

61. The device of claim 60, wherein at least one of the first fill areas has an opening comprising material of the semiconductor body laterally surrounded by material of the at least one of the first fill areas.

62. A semiconductor device, comprising:

a first isolation structure formed in a first isolation region of a semiconductor body;

a second isolation structure formed in a second isolation region of the semiconductor body; and a plurality of fill structures formed in the semiconductor body between the first and second isolation regions, a first fill structure comprising an opening, the opening comprising material of the semiconductor body laterally surrounded by material of the one of the first and second fill structures, and a second fill structure having a different number of openings than the first fill structure.

63. The device of claim 62, wherein the first fill structure comprises a plurality of first fill areas arranged in a first pattern having a first pattern size, and wherein the second fill structure comprises a plurality of second fill areas arranged in a second pattern having a second pattern size, the first and second pattern sizes being different.

* * * * *